United States Patent
Melanson et al.

(10) Patent No.: US 8,447,050 B2
(45) Date of Patent: *May 21, 2013

(54) THERMAL FEEDBACK FOR SWITCH MODE AMPLIFICATION

(75) Inventors: John L. Melanson, Austin, TX (US); Xiaofan Fei, Austin, TX (US); Johann G. Gaboriau, Austin, TX (US); Steven Green, Austin, TX (US); Jason P. Rhode, Austin, TX (US); Eric Walburger, Austin, TX (US); Wilson E. Taylor, Jr., Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 294 days.

This patent is subject to a terminal disclaimer.

(21) Appl. No.: 12/909,262

(22) Filed: Oct. 21, 2010

(65) Prior Publication Data

US 2011/0075723 A1    Mar. 31, 2011

Related U.S. Application Data

(63) Continuation of application No. 10/234,896, filed on Sep. 4, 2002, now Pat. No. 7,840,015.

(51) Int. Cl.
*H03F 99/00* (2009.01)
*H03F 3/38* (2006.01)

(52) U.S. Cl.
USPC ............. 381/120; 381/117; 330/2; 330/10; 330/207 A; 330/289

(58) Field of Classification Search
USPC ............. 381/102, 104–107, 109, 118, 120, 381/123, 117; 330/2, 10, 251, 207 A, 289
See application file for complete search history.

(56) References Cited

U.S. PATENT DOCUMENTS

| | | | |
|---|---|---|---|
| 7,570,118 B1 * | 8/2009 | Gaboriau et al. | 330/298 |
| 7,706,545 B2 * | 4/2010 | Kost et al. | 381/55 |
| 7,840,015 B1 * | 11/2010 | Melanson et al. | 381/107 |
| 8,018,280 B2 * | 9/2011 | Chen et al. | 330/251 |
| 2003/0058039 A1 | 3/2003 | Noro | |
| 2006/0012428 A1 * | 1/2006 | Ohkuri | 330/251 |

* cited by examiner

*Primary Examiner* — Xu Mei
(74) *Attorney, Agent, or Firm* — Steven Lin, Esq.

(57) ABSTRACT

A thermal sensor at the output of a switching amplifier senses heat dissipation at the output switch. If an overheating condition is sensed, gain of the digital input signal is lowered to reduce output power of the audio output signal.

16 Claims, 4 Drawing Sheets

THERMAL FEEDBACK FOR SWITCH MODE AMPLIFICATION

This application is a continuation application and claims the benefit of U.S. patent application Ser. No. 10/234,896, filed Sep. 4, 2002 now U.S. Pat. No. 7,840,015, and entitled "Thermal Feedback For Switch Mode Amplification."

FIELD OF THE INVENTION

The present invention relates to a switched mode digital amplifier utilizing a thermal feedback.

BACKGROUND OF THE RELATED ART

The use of switched mode output stage(s) in audio amplification, in which the conversion is performed digitally, allows audio output from digital signal input. The digital signal conversion may be achieved by a variety of devices. One particular technique utilizes a delta-sigma ($\Delta\Sigma$) modulator, in which the digital input signal is filtered and then quantized to produce an output. In one switched technique, the noise-shaped quantized signal from the quantizer is coupled to a pulsewidth modulator (PWM), in which a value of the quantized signal controls the duty cycle of the PWM output. This PWM output then controls the operation of a switching device or devices, utilized as the output stage of an amplifier to drive a load. The filtered digital signal is used to modulate the pulsewidth of the PWM signal to control the duration of the switch on/off time of the output stage to the load. Thus, delta-sigma modulator circuitry coupled with a PWM circuitry may be utilized to operate as a switching amplifier to drive a load. Accordingly, digital signals are converted to an audio drive signal to drive a load, such as an audio speaker.

With the switching device(s) in the output circuitry of the switch mode amplifier, some amount of power is consumed. If the switching devices of the switching amplifier were ideal (that is, having zero impedance in the "on" state and infinite impedance in the "open" state) and switched instantaneously, the efficiency of the system would be at one hundred percent (100%). In the ideal case, all of the power provided by the power supply would be delivered to the load, and the switches would not dissipate heat. However, in actual practice, switches have some amount of heat loss, which, in some instances, may be significant. For example, the power loss may be in the order of ten percent (10%) of the input power. The switches are typically implemented using electronic devices, such as field-effect-transistors (FETs) or bipolar devices, although other devices may be utilized. These devices all have non-zero "on" resistance and require time to switch states, which may be significant in some instances. The effects typically will result in power dissipation in the switches, contributing to the heating of the switching devices.

Audio signals typically have a high peak power to average power ratio. In the long term, the average signal is significantly less than the maximum possible signal power. Since typical audio systems are designed to handle the average condition, many systems may not be able to sustain a prolonged peak signal condition. The situation is especially true of consumer products, which are designed more for the average case and sacrifices ways to compensate for the worse case conditions. Generally, this approach is implemented to keep a lower cost for the system. Therefore, in some instances, when higher signal levels are processed, a tendency for the switches to overheat may exist and result in deterioration of the system response.

Generally, in order to prevent overheating of the switches that could result in component destruction, some switching amplifiers have employed protection mechanisms that open the circuit connection to the power supply or disconnect the load to prevent overheating or destruction of the switching circuit. For example, fuses may be employed to ensure an open circuit when the switching circuit draws excessive current. These known techniques cause an abrupt shut down of the system or abrupt disconnect of the signal to the output. Thus, the practical implication of these types of protection schemes results in the abrupt disconnect of the audio output to the speakers so that no sound emanates from the speakers.

A need and desire exist to have a less drastic way of addressing overheating conditions at the output instead of abruptly removing the audio output.

SUMMARY OF THE INVENTION

A switching amplifier, which receives a digital input signal and outputs an audio signal in response to the input signal, is disclosed. A thermal sensor senses heat dissipation of an output switch or switches of the switching amplifier, and if an overheating condition is sensed, a gain control unit, reduces a gain of the digital input signal to lower the output power of the audio signal.

DETAILED DESCRIPTION OF THE EMBODIMENTS

Figure 1:
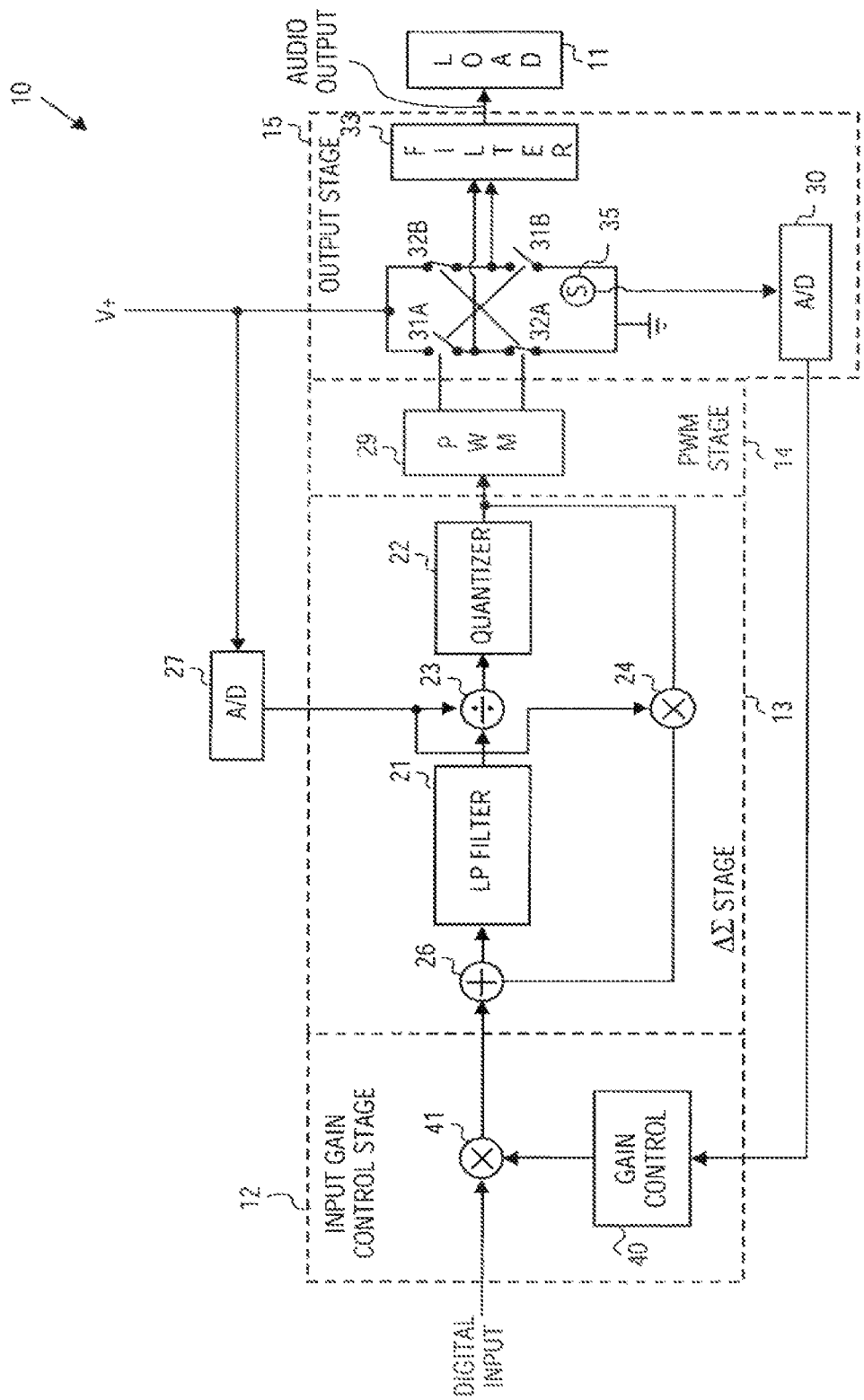
FIG. 1 is an exemplary block schematic diagram of an embodiment of a switching amplifier implementing a thermal feedback to adjust a gain of the input.

FIG. 1 illustrates an exemplary audio switching amplifier circuit 10 (also referred to as a switch mode amplifier) that implements a power supply based compression. The exemplary circuit 10 of FIG. 1 shows one embodiment for practicing the present invention. The embodiment of the invention shown in FIG. 1 is switching amplifier circuit 10 having four stages to convert a digital input signal to an audio output. The audio output signal from the amplifier is coupled to a load 11. Although only four stages are shown to describe the operation of switching amplifier circuit 10, other stages and/or circuitry may be present in other embodiments implementing the invention.

In the particular exemplary embodiment of FIG. 1, an input gain control stage 12, a delta-sigma ($\Delta\Sigma$) stage 13, a pulsewidth modulation (PWM) stage 14, and an output stage 15 are the four stages of switching amplifier circuit 10. Load 11 receives the audio output from output stage 15. The input to input gain control stage 12 is a digital signal input, generally an audio digital signal input for audio applications. $\Delta\Sigma$ stage 13, which follows the input gain control stage 12, filters the input signal and quantizes the filtered signal utilizing a delta-sigma modulation technique. The noise-shaped quantized signal from $\Delta\Sigma$ stage 13 controls the pulsewidth modulation of PWM stage 14 to generate an output from output stage 15. The PWM signal to output stage 15 controls the operation of the switches of the switching amplifier, which couple the power supply voltage to drive load 11.

Input gain control stage 12 receives the digital input signal, adjusts the gain of the digital signal, and couples the gain adjusted digital signal to ΔΣ stage 13. A more detail description of input gain control stage 12 is described later in this disclosure. ΔΣ stage 13 receives the gain adjusted digital signal, filters the digital signal, and quantizes the filtered signal so that a noise-shaped signal is output from ΔΣ stage 13. This noise-shaped signal is then used to drive PWM stage 14, which then drives output stage 15. Switching amplifier circuit 10 utilizes a low-pass filter 21 to filter the digital signal, and the filtered signal is coupled to a quantizer 22 after passing through a divider 23. Divider 23 is shown disposed between LP filter 21 and quantizer 22.

Divider 23 divides the output of LP filter 21 by a voltage value, which may be the power supply voltage value (e.g., value of V+) itself or a proportional amount, and quantizer 22 quantizes the filtered signal. The output of quantizer 22 is coupled through a multiplier 24 and fed back into a feedback loop to the input of LP filter 21. A summation node 26 is utilized to sum the coupled feedback signal with the input signal at the input of LP filter 21. Generally, divider 23 compensates for the voltage on the output switches, and multiplier 24 compensates for divider 23 in the feedback path. In typical practice, an analog to digital (A/D) converter 27 is utilized to convert power supply voltage V+ to a digital value to control divider 23 and multiplier 24. By monitoring power supply voltage V+, divider 23 and multiplier 24 are correspondingly adjusted to compensate for the changes in the power supply. A variety of ΔΣ modulator and PWM circuitry may be implemented to provide the filtering, noise-shaping, and modulation to drive output stage 15 to develop the corresponding output signal to load 11.

The output of quantizer 22 is a noise-shaped signal corresponding to the input digital signal. The quantizer output is coupled to a PWM circuit 29. A variety of pulse-shaping circuitry may be used for PWM circuit 29. The pulsewidth of the signal output from PWM circuit 29 corresponds to the value of the digital audio signal input to switching amplifier circuit 10, in which the value has some amount of power supply compensation provided by the combination of the divider/multiplier network. The output of PWM circuit 29 is then coupled to output stage 15 and, in the particular embodiment shown, output stage 15 includes the switching devices for switching amplifier circuit 10. Switching amplifier circuit 10 includes switches 31a-b and 32a-b, which are utilized to switch power supply voltage V+ to load 11 through a filter 33. Switches 31a and 32a are serially arranged between power supply voltage (V+) and its return, which is shown as ground in this instance. Switches 31b and 32b are likewise arranged serially between V+ and return (e.g., ground). Switches 31a-b, 32a-b may be of a variety of components, including power FETs (field-effect-transistors).

During operation of switching amplifier circuit 10, four switches form a bridge configuration with the output to the filter taken at the junctions of switches 31a/32a and 31b/32b. Switches 31a, 31b operate together as a switch pair, and switches 32a, 32b operate together as another switch pair. One pair of switches 31 (or 32) is open while the other switch pair 32 (or 31) is closed. The determination of which switch is open or closed is determined by the state of the signal from PWM circuit 29. Thus, by alternately opening and closing the switch pairs 31, 32, the voltage output to load 11 is controlled by the duration of the duty cycle of the signal from PWM circuit 29. The actual number of switches will vary depending on the particular circuit employed. In some instances, only one set of switches may be utilized. In other instances, more than one set of switches may be used. The bridge circuit shown is just one exemplary embodiment of using such output switches.

In switching amplifier circuit 10, the return for power supply voltage V+ is shown as a ground. However, in other embodiments, the return may be a voltage, such as V−, so that load 11 operates between positive and negative supply rail voltages. Filter 33 operates to filter out high frequency components so that only the lower frequency components (audio signals) are coupled to load 11. Load 11 may include a variety of audio driven devices, and, in one embodiment, load 11 is a speaker or set of speakers.

Switching amplifiers may have overheating protection mechanisms when the output switches overheat. The output signal is disconnected from load 11 either by an open circuit or by removing the drive voltage. In either way, the audio output is no longer present at load 11. Many commercially available audio systems tend to have a power supply/output stage configuration that adequately operates under general operating conditions but may overheat in certain extreme operating conditions, such as when the signal is driven near a peak level and maintained at that level for a sufficient duration of time. In these instances, some systems have turned off the output to prevent damage to the system.

Exemplary switching amplifier circuit 10 utilizes one scheme, which allows the output to be maintained even when signal conditions that may lead to overheating are encountered. Output stage 15 includes a thermal sensor 35 that monitors (senses, or detects) temperature of switching devices 31, 32. The thermal sensing may be at the location of switches 31, 32 or proximal to the switches. In one exemplary embodiment, a thermistor is utilized as thermal sensor 35. Other devices and components may be readily utilized for thermal sensor 35.

The thermal indication from thermal sensor 35 is then coupled to an analog-to-digital (A/D) converter 30 so that the thermal indication is converted into a digital value. The digital thermal indication value is then coupled to a gain control unit 40 of input gain control stage 12 as a feedback signal. Gain control unit 40 monitors the thermal condition of output switches 31, 32 and sends a control signal to control the gain of the digital input signal to the input of ΔΣ stage 13. The gain adjustment is shown by multiplier unit 41 in input gain control stage 12. Thus, gain control unit 40 correspondingly adjusts the gain of the input signal c based on the value of the thermal indication in output stage 15.

When an overheating condition (or conditions which would lead to overheating) is sensed at output stage 15, the output of thermal sensor 35 sends an indication of such a condition to gain control unit 40. Gain control unit 40 responds by lowering the gain of the input signal so that the full scale peak of the input signal is reduced which causes a corresponding decrease in the drive of PWM stage 14 so that the drive of output stage 15 is reduced. The reduced signal amplitude at output stage 15 lowers the output signal, and the lower power consumption allows the output switches to generate less heat. The resulting action of switching amplifier circuit 10, when the output stage overheats or begins to overheat, is an automatic lowering of the input gain. The gain level returns when the overheating condition or beginning of overheating condition no longer is present.

Figure 2:
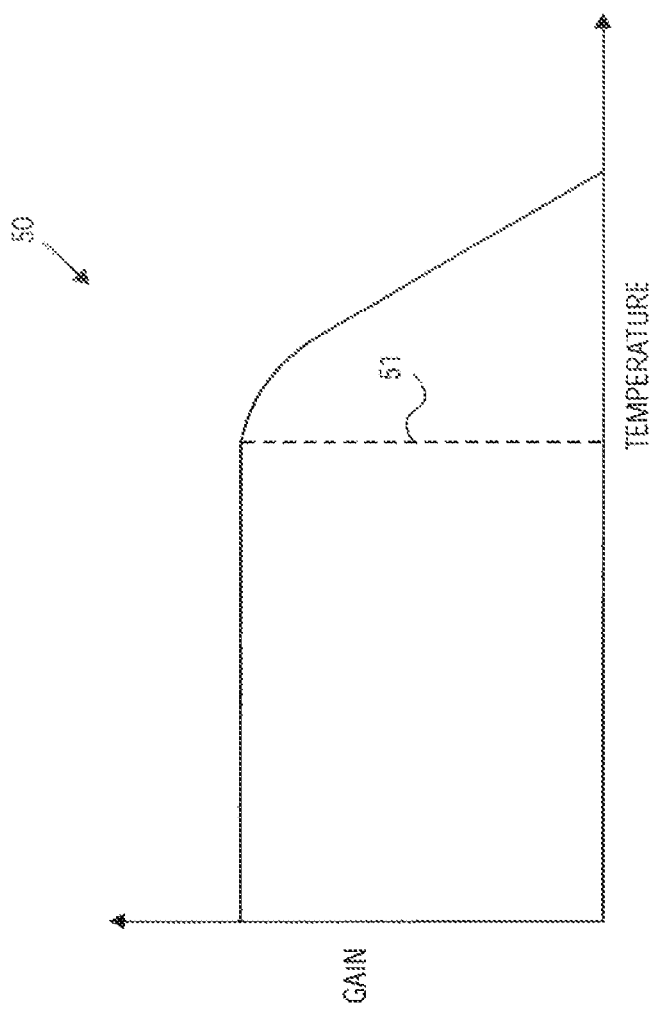
FIG. 2 is an exemplary waveform diagram showing gain versus temperature to employ the thermal feedback.

FIG. 2 illustrates an exemplary waveform diagram 50 showing a gain versus temperature curve. The gain of the input signal remains fairly constant until the temperature of the output stage reaches a pre-established level (shown by dotted line 51). Subsequently, if the temperature continues to rise, the gain is correspondingly reduced. In FIG. 2, waveform diagram 50 shows a linear reduction of the gain versus temperature. However, the decrease may be made non-linear in other embodiments.

Figure 3:
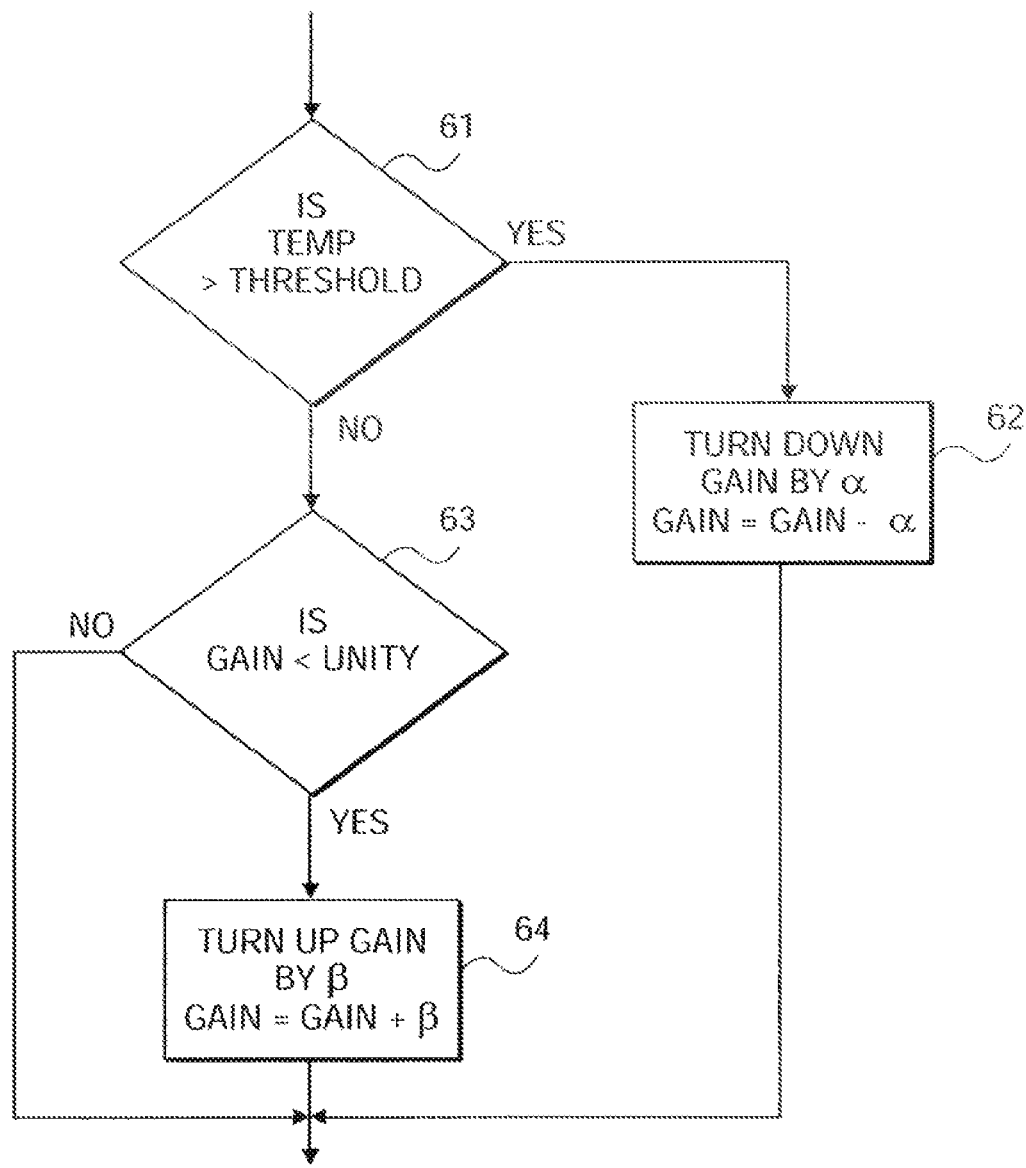
FIG. 3 is an exemplary flow diagram of an application to control the gain of the input signal.

One embodiment for performing the gain control by software is shown in FIG. 3. In the software implementation, the gain control unit receives the temperature indication from A/D converter 30. A threshold value for overheating is predetermined and stored as a value, which is made available to gain control unit 40. If the sensed temperature value is greater than the threshold value (at block 61), then the gain is turned down (at block 62). In FIG. 3, the gain is reduced by a coefficient α. If the temperature is not above the threshold, then the gain is checked (at block 63). If the gain is less than the established value (which is unity in the example), then the gain is increased by a coefficient β (at block 64). Otherwise, the gain is not increased. This decision loop is performed repeatedly to decrease the gain when the sensed temperature reaches the preselected overheating value and to increase the gain to unity (or some selected maximum value) when the overheating condition is removed. The coefficients α and β determine the rate at which the gain is changed. The rate of change is a design choice and may be dictated by dynamics of the system. Another consideration is to make the gain changing operation transparent to the listener, as the volume of the audio from the speakers changes in response to the gain change. Furthermore, the gain adjustment control may be implemented in hardware or software, of both. FIG. 3 shows an exemplary implementation in software, where the α and β values may be programmable.

In an alternative embodiment, the thermal feedback control for controlling the input signal gain may be coupled with a complete shut down of the output drive. In some instances, the power consumption may be such that lowering of the gain at the input still may not be adequate to control the overheating condition of the switching devices in output stage 15. Accordingly, some limit may be placed on the actual heat dissipation that will trigger a shutdown of the output signal. For example, power supply voltage V+ to drive the output may be disconnected when a particular temperature is reached. In one exemplary embodiment, the same control feedback signal to the input gain stage may be monitored for complete shutdown when an upper threshold value is reached. A variety of devices or circuits, including known techniques for turning off outputs, may be employed to disconnect the output drive or the supply voltage to accomplish the shut down.

Figure 4:
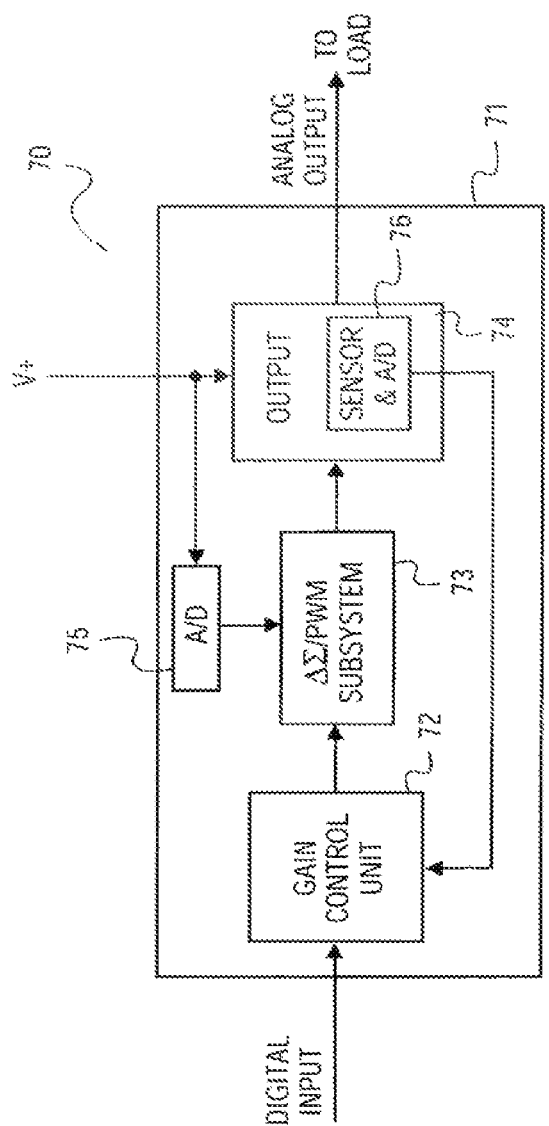
FIG. 4 is an exemplary block schematic diagram of an integrated circuit utilizing the switching amplifier of FIG. 1.

FIG. 4 illustrates a more generic exemplary embodiment for implementing the gain control technique to adjust for temperature changes. In this exemplary embodiment, the circuitry 71 is part of an integrated circuit 70 (such as an integrated circuit fabricated on a silicon wafer), in which a digital input signal is input to integrated circuit 70, and an audio signal is output from integrated circuit 70. The output is generally coupled to a load 11, such as a speaker(s). A power supply voltage is coupled to integrated circuit 70 from a separate power supply unit. Again, more than one supply voltage may be coupled to integrated circuit 70. Four stages 12-15 of FIG. 1 are shown implemented within integrated circuit 70 as units 72-74, along with A/D converter 27 which is now shown as A/D 75. In this exemplary embodiment, ΔΣ stage 13 and PWM stage 14 are shown implemented together as the ΔΣ/PWM subsystem 73. Similarly, sensor 35 and A/D converter 30 of FIG. 1 are shown together as sensor and A/D unit 76. Integrated circuit 70 may include processing components, as well as memory, to control and process the data associated with the components within integrated circuit 70. Thus, software to adjust the input gain and/or processing power to perform the processing may be included as part of integrated circuit 70. Alternatively, processing and/or data storage operations may be relegated to components or devices external to integrated circuit 70.

Accordingly, the temperature sensing scheme as described in reference to exemplary embodiment shown in FIG. 1 may be readily implemented in integrated circuit 70. One sensor may be used or, alternatively multiple sensors may be used in the output stage 15. A single sensor 76 may be used if the temperature of all switches is likely to be similar. Alternatively, if the temperature may vary between the various switches, a sensor may be used per switch or per grouping of switches having similar temperature properties. With multiple sensors, multiple A/D converters 75 may be utilized. Gain control unit 72 may be set to react to each sensor or to some combination of sensed values, when multiple sensors are used. Thus, with the lowering of the gain at high temperature indications, the output device may be maintained at a safe level. If the signal level decreases, power dissipation also decreases and the output temperature will fall, allowing the gain to be increased back to a previous or other predetermined, level. The sensing technique is especially appropriate for an integrated circuit implementation, in which the temperature sensor and the switches may be integrated onto one die.

Thus thermal feedback for switched mode amplification is described. While the embodiments of the invention have been particularly shown and described it will be understood by those skilled in the art that various changes in form and detail may be made therein without departing from the spirit and scope of the invention.

We claim:

1. An apparatus, comprising:
  a pulsewidth modulation amplifier which receives an input signal and outputs an output signal in response to the input signal;
  a thermal sensor coupled to said pulsewidth modulation amplifier to sense a temperature of the pulsewidth modulation amplifier; and
  a gain control unit coupled to receive a control signal indicative of the sensed temperature from said thermal sensor and to adjust a gain of the input signal in response to the control signal to maintain said pulsewidth modulation amplifier from overheating.

2. The apparatus of claim 1, wherein said pulsewidth modulation amplifier includes a delta-sigma filter and a quantizer stage to filter and quantize the input signal and further includes a pulse-shaping circuit to pulse modulate a corresponding switching signal to drive an output switch of said switching amplifier and further comprises an analog-to-digital converter for converting an analog signal for the sensed temperature to a digital signal that is the control signal and the control signal is coupled to the gain control unit as a feedback signal and also further comprises a multiplier unit that adjusts the gain by multiplying a gain control signal output from the gain control unit with the input signal.

3. The apparatus of claim 2, wherein said thermal sensor is coupled to sense temperature of the output switch.

4. The apparatus of claim 3, wherein the gain of the input signal is set to a predetermined value and the gain is to be reduced when an overheating condition is sensed at the output switch by said thermal sensor.

5. The apparatus of claim 4, wherein said pulsewidth modulation amplifier and thermal sensor are fabricated as an integrated circuit.

6. The apparatus of claim 3, further comprising an analog-to-digital converter to convert the sensed temperature to a digital control signal to control the gain.

7. The apparatus of claim 1, wherein said pulsewidth modulation amplifier further comprises a filter and a quantizer to form a delta-sigma modulator stage to filter and quantize the digital input signal and wherein a divider and a multiplier are utilized to compensate for slow changes in a supply voltage.

8. An apparatus, comprising:
- a pulsewidth modulation amplifier which receives an input signal and outputs an audio signal in response to the input signal;
- a thermal sensor coupled to an output switching device of said pulsewidth modulation amplifier to sense a temperature of the switching device; and
- a gain control unit coupled to receive a control signal indicative of the sensed temperature of the switching device and to adjust a gain of the input signal in response to the control signal to maintain the switching device from overheating.

9. The apparatus of claim 8, wherein said pulsewidth modulation amplifier comprises a delta-sigma modulator and a quantizer to sample and filter the input and further comprises a pulse-shaping circuit to pulse modulate a corresponding switching signal to drive the output switching device and further comprises an analog-to-digital converter for converting an analog signal for the sensed temperature to a digital signal that is the control signal and the control signal is coupled to the gain control unit as a feedback signal and also further comprises a multiplier unit that adjusts the gain by multiplying a gain control signal output from the gain control unit with the input signal.

10. The apparatus of claim 9, wherein said pulsewidth modulation amplifier comprises a plurality of switching devices and said thermal sensor is coupled to sense temperature of at least one of the switching devices.

11. The apparatus of claim 10, wherein said pulsewidth modulation amplifier comprises a plurality of switching devices and a plurality of thermal sensors, wherein multiple temperatures are to be sensed to control the gain of the input signal.

12. The apparatus of claim 11, wherein said pulsewidth modulation amplifier and thermal sensors are fabricated as an integrated circuit.

13. The apparatus of claim 9, further comprising an analog-to-digital converter to convert the sensed temperature to a digital control signal to control the gain.

14. The apparatus of claim 8, wherein said pulsewidth modulation amplifier further comprises a filter and a quantizer to form a delta-sigma modulator stage to filter and quantize the input signal and wherein a divider and a multiplier are utilized to compensate for slow changes in a supply voltage.

15. The apparatus of claim 1 wherein the apparatus is a single integrated circuit.

16. The apparatus of claim 8 wherein the apparatus is a single integrated circuit.

* * * * *